United States Patent
Ogino

(10) Patent No.: US 7,446,533 B2
(45) Date of Patent: Nov. 4, 2008

(54) RF SHIELDING METHOD, MRI APPARATUS, AND TRANSMITTING/RECEIVING SURFACE COIL

(75) Inventor: Tetsuo Ogino, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 11/548,302

(22) Filed: Oct. 11, 2006

(65) Prior Publication Data

US 2007/0132453 A1 Jun. 14, 2007

(30) Foreign Application Priority Data

Oct. 13, 2005 (JP) ............................ 2005-298288

(51) Int. Cl.
*G01V 3/00* (2006.01)
(52) U.S. Cl. ...................................... 324/322; 324/318
(58) Field of Classification Search ......... 324/318–322; 600/407–449
See application file for complete search history.

(56) References Cited

U.S. PATENT DOCUMENTS

| | | | | |
|---|---|---|---|---|
| 4,954,781 A | * | 9/1990 | Hirata | 324/318 |
| 5,159,929 A | * | 11/1992 | Morris et al. | 600/411 |
| 5,243,287 A | * | 9/1993 | Hashoian et al. | 324/318 |
| 5,378,989 A | | 1/1995 | Barber et al. | |
| 5,760,584 A | * | 6/1998 | Frederick | 324/318 |
| 5,986,531 A | * | 11/1999 | Carrozzi | 335/301 |
| 5,990,681 A | * | 11/1999 | Richard et al. | 324/318 |
| 5,998,999 A | * | 12/1999 | Richard et al. | 324/318 |
| 6,144,204 A | | 11/2000 | Sementchenko | |
| 6,154,110 A | | 11/2000 | Takeshima | 335/299 |
| 6,252,404 B1 | * | 6/2001 | Purgill et al. | 324/318 |
| 6,466,018 B1 | * | 10/2002 | Dumoulin et al. | 324/318 |
| 6,512,374 B1 | * | 1/2003 | Misic et al. | 324/319 |
| 6,563,315 B1 | | 5/2003 | Boskamp et al. | |
| 6,636,039 B1 | * | 10/2003 | Nistler | 324/318 |
| 6,714,013 B2 | * | 3/2004 | Misic | 324/318 |
| 6,777,937 B1 | * | 8/2004 | Miller et al. | 324/318 |
| 6,788,057 B1 | * | 9/2004 | Petropoulos et al. | 324/318 |
| 6,791,321 B2 | * | 9/2004 | Willig-Onwuachi et al. | 324/309 |
| 6,825,660 B2 | * | 11/2004 | Boskamp | 324/318 |
| 6,853,193 B2 | * | 2/2005 | Riederer et al. | 324/318 |
| 6,924,644 B2 | * | 8/2005 | Suits et al. | 324/318 |
| 7,012,430 B2 | * | 3/2006 | Misic | 324/318 |
| 7,116,535 B2 | * | 10/2006 | Huang | 361/19 |

(Continued)

FOREIGN PATENT DOCUMENTS

JP 2004248928 9/2004

*Primary Examiner*—Brij B Shrivastav
(74) *Attorney, Agent, or Firm*—Armstrong Teasdale LLP

(57) ABSTRACT

In order to reduce the cost for isolation between a surface coil and a body coil installed on a magnet assembly side, an RF shield for a surface coil is disposed between a body coil installed on a magnet assembly side of an MRI apparatus and a surface coil body not installed on the magnet assembly side. The reception by the body coil of RF pulses transmitted from the surface coil body is suppressed by the RF shield for the surface coil. Since an induced voltage in the body coil drops to a great extent, a switch provided on the body coil side no longer requires a component resistant to high voltage and high current. Thus, the apparatus can be simplified and the cost can be reduced. As a result, the reliability of the apparatus is improved.

20 Claims, 4 Drawing Sheets

U.S. PATENT DOCUMENTS 7,202,668 B2 * 4/2007 Ludwig et al. .............. 324/318
7,276,909 B2 * 10/2007 Nukihara et al. ............ 324/322
2003/0210048 A1 * 11/2003 Riederer et al. ............ 324/309
2003/0231018 A1 * 12/2003 Willig-Onwuachi et al. 324/318
2004/0248928 A1 12/2004 Downey et al.
2005/0057251 A1 * 3/2005 Suits et al. .................. 324/318
2006/0158191 A1 * 7/2006 Ludwig et al. .............. 324/318

* cited by examiner

RF SHIELDING METHOD, MRI APPARATUS, AND TRANSMITTING/RECEIVING SURFACE COIL

CROSS REFERENCE TO RELATED APPLICATIONS

This application claims the benefit of Japanese Application No. 2005-298288 filed Oct. 13, 2005.

BACKGROUND OF THE INVENTION

The present invention relates to an RF shielding method, an MRI (Magnetic Resonance Imaging) apparatus, and a transmitting/receiving surface coil. More particularly, the present invention is concerned with an RF shielding method, an MRI apparatus, and a transmitting/receiving surface coil, which can reduce the cost for isolation of a body coil installed on a magnet assembly side, from a surface coil.

Heretofore, there has been known a technique wherein an RF shield is provided between a body coil installed on a magnet assembly side and a gradient magnetic field coil (see, for example, Patent Literatures 1 and 2).

[Patent Literature 1] Japanese Unexamined Patent Publication No. 2000-11619

[Patent Literature 2] Japanese Unexamined Patent Publication No. 2004-248928

Heretofore, isolation of a gradient magnetic field coil against RF pulses transmitted from a body coil installed on a magnet assembly side has been performed through an RF shield, but isolation of a body coil installed on a magnet assembly side against RF pulses transmitted from a surface coil has been performed using a switch provided on the body coil side to switch ON/OFF condition of a diode from one to the other through a bias power supply and thereby turn ON or OFF the body coil.

However, the bias power supply is of a large current or large voltage specification and a high performance filter for the prevention of noise propagation is required, thus resulting in an increase of the apparatus scale and of cost. Besides, for the switch provided on the body coil side, it is necessary to use a component resistant to high current and high voltage such as a diode for a large current, thus also giving rise to the problem that the cost becomes high.

SUMMARY OF THE INVENTION

Therefore, it is an object of the present invention to provide an RF shielding method, an MRI apparatus, and a transmitting/receiving surface coil, which can reduce the cost for isolation between a surface coil and a body coil installed on a magnet assembly side.

In one aspect of the present invention there is provided an RF shielding method comprising providing an RF shield between a body coil installed on a magnet assembly side of an MRI apparatus and a surface coil not installed on the magnet assembly side, to suppress reception by the body coil of RF pulses transmitted from the surface coil.

According to the RF shielding method in the above one aspect of the present invention, since the reception by the body coil of RF pulses transmitted from the surface coil is suppressed by the RF shield disposed between the two, an induced voltage in the body coil drops to a great extent. Consequently, the switch provided on the body coil side can dispense with a component resistant to high voltage and high current such as a diode for a large current, whereby it is possible to reduce the cost. Moreover, it becomes unnecessary to use a bias power supply of a large current or large voltage specification and the use of a high performance filter also becomes unnecessary. Thus, not only the apparatus can be simplified but also the cost can be reduced. As a result, the reliability of the apparatus is improved.

In a second aspect of the present invention there is provided an MRI apparatus comprising: a body coil installed on a magnet assembly side; a surface coil not installed on the magnet assembly side; and an RF shield provided between the body coil and the surface coil to suppress reception by the body coil of RF pulses transmitted from the surface coil.

According to the MRI apparatus in the above second aspect, since the reception by the body coil of RF pulses transmitted from the surface coil is suppressed by the RF shield disposed between the two, an induced voltage in the body coil drops to a great extent. Consequently, the switch provided on the body coil side no longer requires a component resistant to high voltage and current such as a diode for a large current, whereby it is possible to reduce the cost. Moreover, it is no longer required to use a bias power supply of a large current or voltage nor is it required to use a high performance filter. Thus, not only the apparatus can be simplified but also the cost can be reduced. Eventually, the apparatus reliability is improved.

In a third aspect of the present invention there is provided, in combination with the above second aspect, an MRI apparatus wherein the RF shield is integral with the surface coil.

According to the MRI apparatus in the above third aspect, since the RF shield is integral with the surface coil, handling of the apparatus becomes convenient.

In a fourth aspect of the present invention there is provided, in combination with the above fourth aspect, an MRI apparatus wherein the RF shield is separate from the magnet assembly and the surface coil.

According to the MRI apparatus in the above fourth aspect, by removing the RF shield, the body coil installed on the magnet assembly side can be used as a transmitting coil, while the surface coil can be used as a receiving coil.

In a fifth aspect of the present invention there is provided, in combination with the above second aspect, an MRI apparatus wherein the RF shield is installed on the magnet assembly side so that it can be inserted in and removed from between the body coil and the surface coil.

According to the MRI apparatus in the above fifth aspect, since the RF shield is installed on the magnet assembly side, handling of the apparatus is convenient. Besides, by removing the RF shield, the body coil installed on the magnet assembly side can be used as a transmitting coil.

In a sixth aspect of the present invention there is provided a transmitting/receiving surface coil comprising: a surface coil body used in the vicinity of a subject and having a transmitting and receiving function; and an RF shield integral with the surface coil body on the side opposite to the subject.

According to the transmitting/receiving surface coil in the above sixth aspect, since the reception by the body coil of RF pulses transmitted from the transmitting/receiving surface coil is suppressed by the RF shield, an induced voltage in the body coil drops to a great extent. Consequently, the switch provided on the body coil side no longer requires a component resistant to high voltage and high current such as a diode for a large current, whereby the cost can be reduced. Moreover, a bias power supply of a large current or voltage specification is no longer required, nor is required the use of a high performance filter. Consequently, not only the apparatus can be simplified but also the cost can be reduced. Eventually, the apparatus reliability is improved.

In a seventh aspect of the present invention there is provided, in combination with the above sixth aspect, a transmitting/receiving surface coil wherein the surface coil body is cylindrical and the RF shield is in a cylindrical shape which surrounds the outer periphery of the surface coil body.

According to the transmitting/receiving surface coil in the above seventh aspect, the reception by the body coil of RF pulses transmitted from the cylindrical surface coil body can be suppressed suitably by the cylindrical RF shield.

In an eighth aspect of the present invention there is provided, in combination with the above sixth aspect, a transmitting/receiving surface coil wherein the surface coil body is in the shape of a plate and the RF shield is in the shape of a plate integral with one surface side of the surface coil body.

According to the transmitting/receiving surface coil in the above eighth aspect, the reception by the body coil of RF pulses transmitted from the plate-like surface coil body can be suppressed suitably by the plate-like RF shield.

According to the RF shielding method, MRI apparatus and transmitting/receiving surface coil of the present invention it is possible to reduce the cost for isolation between the surface coil and the body coil installed on the magnet assembly side. Further, the reliability can be improved.

The RF shielding method, MRI apparatus and transmitting/receiving surface coil according to the present invention can be utilized in MR imaging which uses a surface coil.

Further objects and advantages of the present invention will be apparent from the following description of the preferred embodiments of the invention as illustrated in the accompanying drawings.

DETAILED DESCRIPTION OF THE INVENTION

Figure 1:
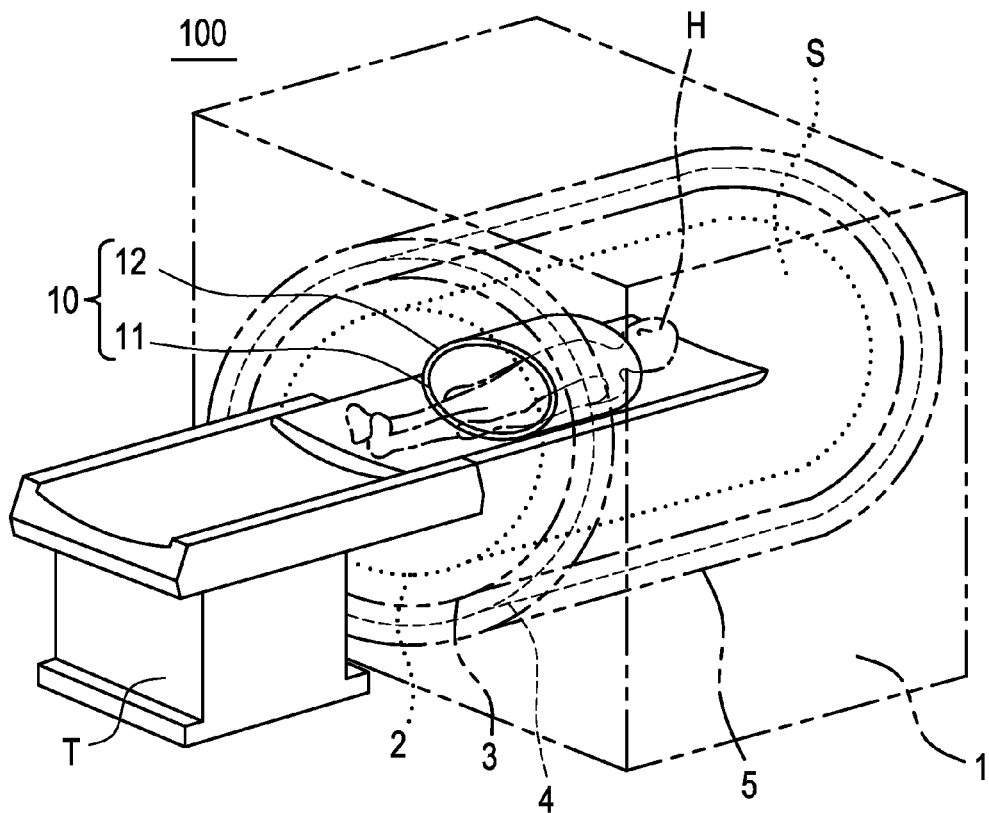
FIG. 1 is a perspective view showing an MRI apparatus and a transmitting/receiving surface coil according to a first embodiment of the present invention.

The present invention will be described in more detail hereinunder by way of embodiments thereof illustrated in the drawings. However, the present invention is not limited to the embodiments.

First Embodiment

FIG. 1 is a perspective view showing an MRI apparatus 100 and a transmitting/receiving surface coil 10 according to a first embodiment of the present invention.

In the MRI apparatus 100, a body coil 2, an RF shield 3 for the body coil, and a gradient magnetic field coil 4, are disposed in the interior of a magnet assembly 1 concentrically and in this order from the inner periphery side. A main magnetic field generating magnet 5 is disposed outside the gradient magnetic field coil 4. Further, a bore (a cylindrical space) S for insertion therein of a subject H placed on a cradle of a table unit T is formed in the magnet assembly 1.

The transmitting/receiving surface coil 10, which is cylindrical, is mounted to the subject H.

The transmitting/receiving surface coil 10 is made up of a cylindrical surface coil body 11 and a cylindrical RF shield 12 for the surface coil which shield 12 surrounds the outer periphery of the surface coil body 11.

Figure 2:
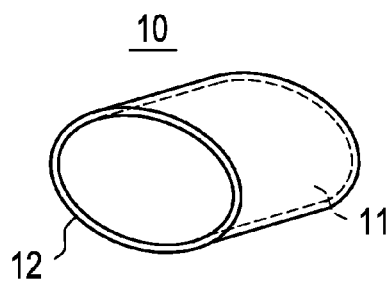
FIG. 2 is a perspective view showing the transmitting/receiving surface coil according to the first embodiment.

In the transmitting/receiving surface coil 10, as shown in FIG. 2, the surface coil body 11 and the RF shield 12 for the surface coil are integral with each other.

According to the MRI apparatus 100 and the transmitting/receiving surface coil 10 of this first embodiment, since the reception by the body coil 2 of RF pulses transmitted from the surface coil body 11 is suppressed by the RF shield 12 for the surface coil, an induced voltage in the body coil 2 drops to a great extent. Therefore, in a switch (not shown) provided on the body coil 2 side, it is no longer required to use a component resistant to high voltage and high current such as a diode for a large current and it is possible to attain the reduction of cost. Likewise, the use of a bias power supply of a large current or large voltage specification becomes unnecessary and so does the use of a high performance filter. Consequently, not only the apparatus can be simplified but also the cost can be reduced. As a result, it is possible to improve the reliability of the apparatus.

Second Embodiment

Figure 3:
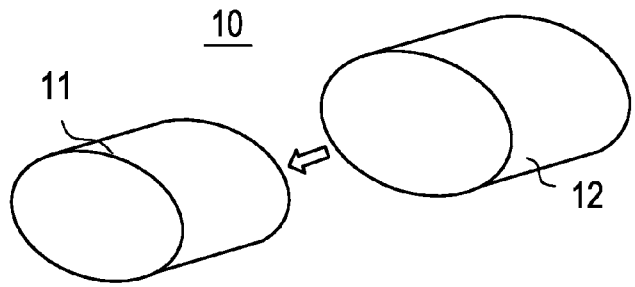
FIG. 3 is a perspective view showing a transmitting/receiving surface coil according to a second embodiment of the present invention.

As shown in FIG. 3, a surface coil body 11 and an RF shield 12 for a surface coil in a transmitting/receiving surface coil 10 may be made separate from each other.

According to the transmitting/receiving surface coil 10 of this second embodiment, by applying the RF shield 12 for the surface coil over the outer periphery of the surface coil body 11, the reception by the body coil 2 of RF pulses transmitted from the surface coil body 11 can be suppressed. On the other hand, by removing the RF shield 12 for the surface coil from the outer periphery of the surface coil body 11, the body coil 2 can be used as a transmitting coil.

Third Embodiment

Figure 4:
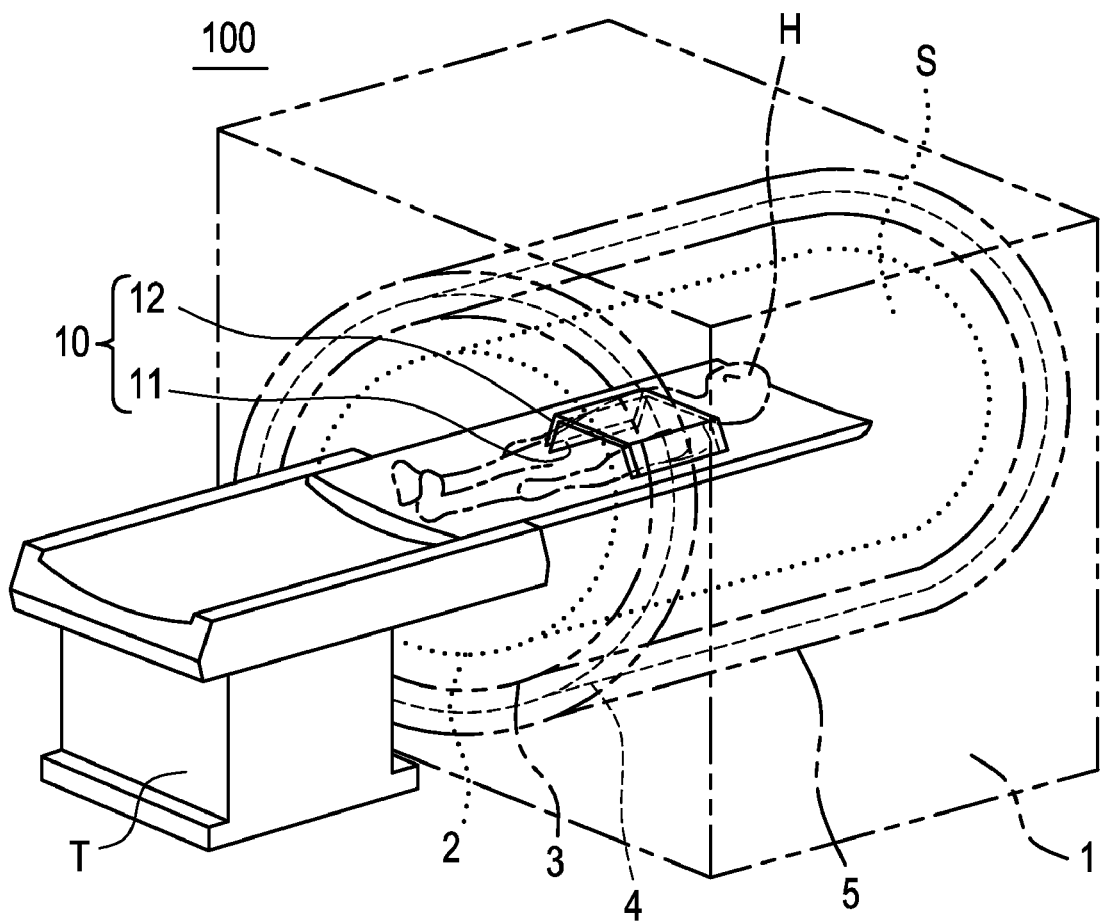
FIG. 4 is a perspective view showing an MRI apparatus and a transmitting/receiving surface coil according to a third embodiment of the present invention.

As shown in FIG. 4, there may be used a plate-like transmitting/receiving surface coil 10.

This transmitting/receiving surface coil 10 is made up of a plate-like surface coil body 11 and a plate-like RF shield 12 for the surface coil which shield is disposed on the side opposite to the subject with respect to the surface coil body 11.

Figure 5:
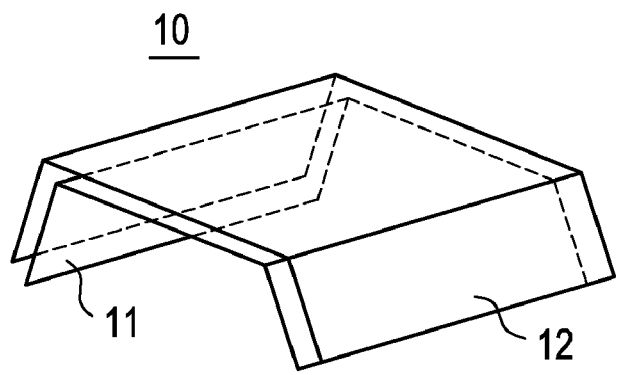
FIG. 5 is a perspective view showing the transmitting/receiving surface coil according to the third embodiment.

As shown in FIG. 5, the surface coil body 11 and the RF shield 12 for the surface coil in the transmitting/receiving surface coil 10 are integral with each other.

Fourth Embodiment

Figure 6:
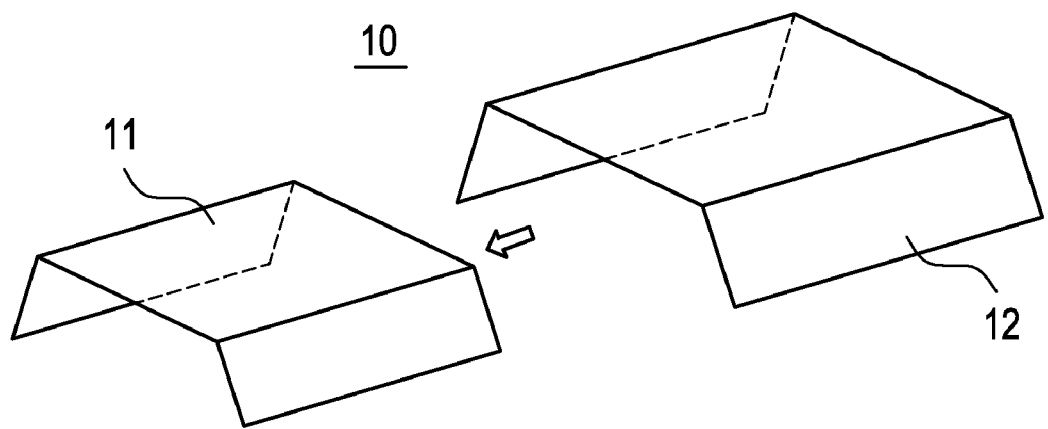
FIG. 6 is a perspective view showing a transmitting/receiving surface coil according to a fourth embodiment of the present invention.

As shown in FIG. 6, a surface coil body 11 and an RF shield 12 for the surface coil in a transmitting/receiving surface coil 10 may be separate from each other.

Fifth Embodiment

Figure 7:
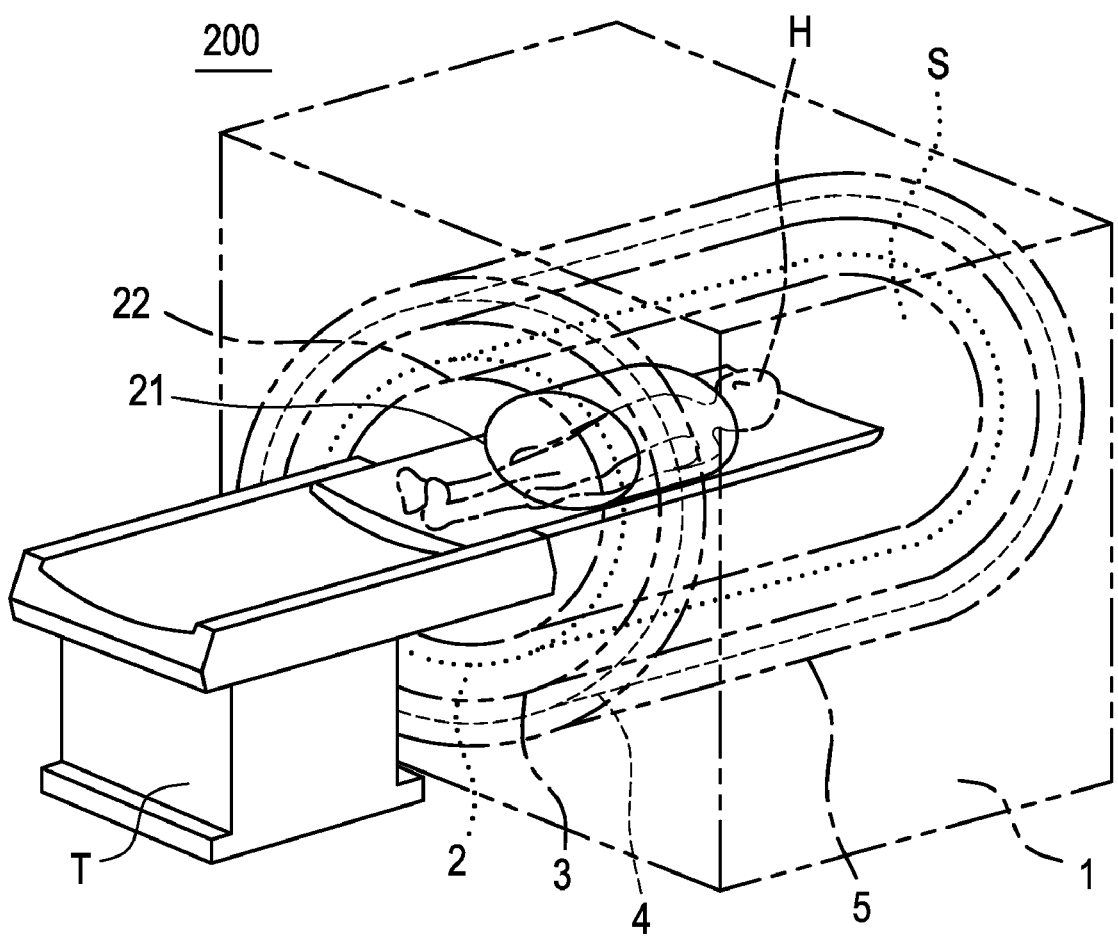
FIG. 7 is a perspective view showing an MRI apparatus (with RF shield inserted) according to a fifth embodiment of the present invention.

FIG. 7 is a perspective view of an MRI apparatus 200 according to a fifth embodiment of the present invention.

In the MRI apparatus 200, an RF shield 22 for a surface coil, a body coil 2, an RF shield 3 for the body coil, and a gradient magnetic field coil 4, are disposed in the interior of a magnet assembly 1 concentrically and in this order from the inner periphery side. A main magnetic field generating magnet 5 is disposed outside the gradient magnetic field coil 4. A bore (a cylindrical space) S for insertion therein of a subject H placed on a cradle of a table unit T is formed in the magnet assembly 1.

A cylindrical surface coil 21 is mounted to the subject H.

According to the MRI apparatus 200 of this fifth embodiment, since the reception by the body coil 2 of RF pulses transmitted from the surface coil 21 is suppressed by the RF shield 22 for the surface coil, an induced voltage in the body coil 2 drops to a great extent. Consequently, a switch (not shown) disposed on the body coil 2 side can dispense with a component resistant to high voltage and high current such as a diode for a large current and it is possible to reduce the cost. Besides, the use of a bias power supply of a large current or large voltage specification becomes unnecessary and so does the use of a high performance filter. Thus, not only the apparatus can be simplified but also the cost can be reduced. As a result, it is possible to improve the reliability of the apparatus.

Figure 8:
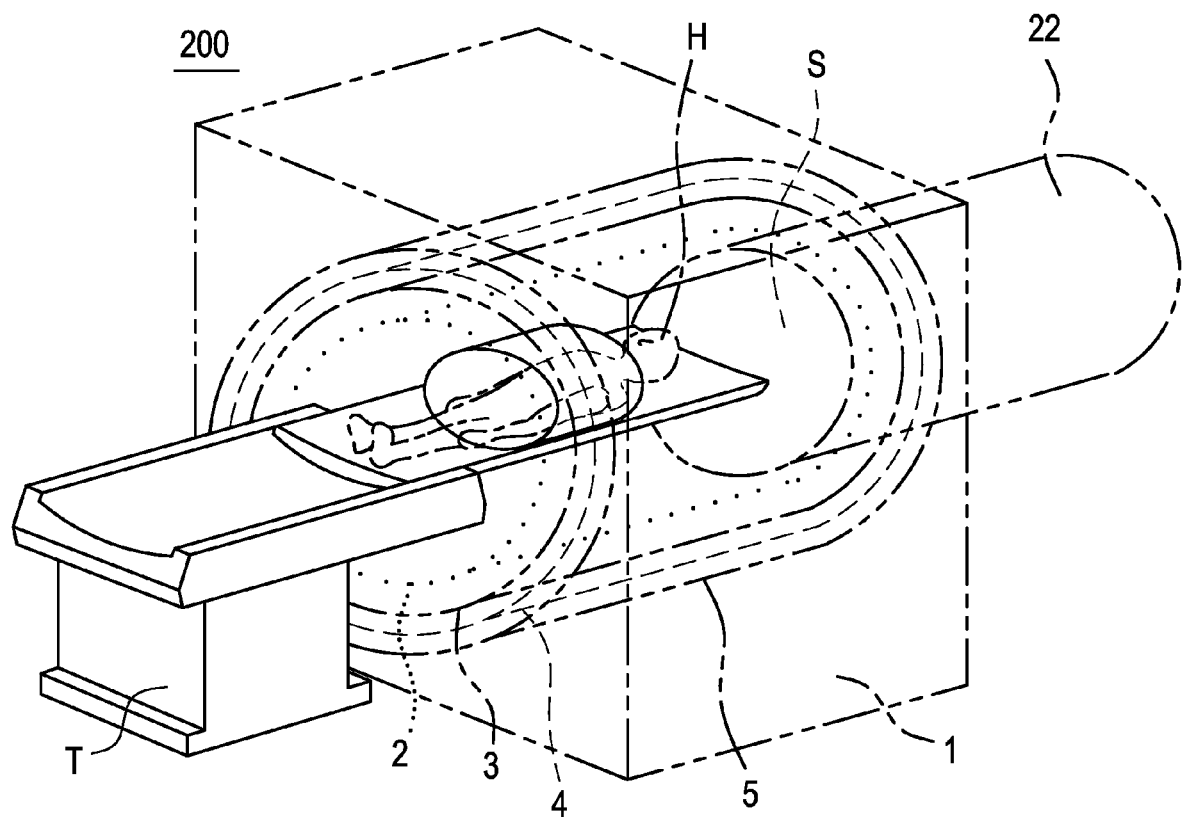
FIG. 8 is a perspective view showing the MRI apparatus (with RF shield removed) according to the fifth embodiment.

As shown in FIG. 8, the RF shield 22 for the surface coil can be drawn out from the bore S manually or automatically.

With the RF shield 22 for the surface coil drawn out from the bore S, the body coil 2 can be used as a transmitting coil.

Many widely different embodiments of the invention may be configured without departing from the spirit and the scope of the present invention. It should be understood that the present invention is not limited to the specific embodiments described in the specification, except as defined in the appended claims.

The invention claimed is:

1. An RF shielding method comprising providing an RF shield between a body coil installed on a magnet assembly side of an MRI apparatus and a surface coil not installed on the magnet assembly side to suppress reception by the body coil of RF pulses transmitted from the surface coil.

2. An MRI apparatus comprising:
   a body coil installed on a magnet assembly side;
   a surface coil not installed on the magnet assembly side; and
   an RF shield provided between the body coil and the surface coil to suppress reception of RF pulses transmitted from the surface coil, by the body coil.

3. An MRI apparatus according to claim 2, wherein the RF shield is integral with the surface coil.

4. An MRI apparatus according to claim 2, wherein the RF shield is separate from the magnet assembly and the surface coil.

5. An MRI apparatus according to claim 2, wherein the RF shield is installed on the magnet assembly side so that it can be inserted in and removed from between the body coil and the surface coil.

6. A transmitting/receiving surface coil comprising:
   a surface coil body used in the vicinity of a subject and having a transmitting and receiving function; and
   an RF shield integral with the surface coil body on the side opposite to the subject, said RF shield configured to substantially suppress reception by a body coil of RF pulses transmitted from the surface coil.

7. A transmitting/receiving surface coil according to claim 6, wherein the surface coil body is cylindrical, and the RF shield is in a cylindrical shape which surrounds the outer periphery of the surface coil body.

8. A transmitting/receiving surface coil according to claim 6, wherein the surface coil body is in the shape of a plate, and the RF shield is in the shape of a plate integral with one surface side of the surface coil body.

9. An RF shielding method according to claim 1, wherein providing an RF shield further comprises providing an RF shield that formed is integrally with the surface coil.

10. An RF shielding method according to claim 1, wherein providing an RF shield further comprises providing an RF shield that is separate from the magnet assembly and the surface coil.

11. An RF shielding method according to claim 1, wherein providing an RF shield further comprises providing an RF shield that is installed on the magnet assembly side and is configured to be removeably coupled between the body coil and the surface coil.

12. An RF shielding method according to claim 1, further comprising providing a surface coil that can be used as a receiving coil.

13. An RF shielding method according to claim 1, further comprising:
   providing a cylindrical surface coil; and
   providing an RF shield having a cylindrical shape which surrounds an outer periphery of the surface coil.

14. An RF shielding method according to claim 1, further comprising:
   providing a surface coil having the shape of a plate; and
   providing an RF shield having the shape of a plate integral with one surface side of the surface coil.

15. An MRI apparatus according to claim 2, wherein the surface coil and the RF shield are configured to mount on a patient within the MRI apparatus, and wherein the body coil is not configured to mount on the patient.

16. An MRI apparatus according to claim 2, wherein the surface coil is cylindrical, and the RF shield is cylindrical and circumscribes an outer periphery of the surface coil.

17. An MRI apparatus according to claim 2, wherein the surface coil is plate shaped, and the RF shield is plate shaped and is integrally formed with one surface side of the surface coil.

18. An MRI apparatus according to claim 2, wherein suppressing reception of RF pulses transmitted from the surface coil facilitates reducing an induced voltage in the body coil.

19. A transmitting/receiving surface coil according to claim 6, wherein the RF shield is installed on a magnet assembly side of an MRI apparatus so that it can be inserted in and removed from between the body coil and the surface coil.

20. A transmitting/receiving surface coil according to claim 6, wherein suppressing reception of RF pulses transmitted from the surface coil facilitates reducing an induced voltage in the body coil.

* * * * *